United States Patent
Walker et al.

(10) Patent No.: US 7,365,045 B2
(45) Date of Patent: Apr. 29, 2008

(54) AQUEOUS CLEANER WITH LOW METAL ETCH RATE COMPRISING ALKANOLAMINE AND TETRAALKYLAMMONIUM HYDROXIDE

(75) Inventors: Elizabeth L. Walker, Nazareth, PA (US); Jeffrey A. Barnes, Nazareth, PA (US); Shahriar Naghshineh, Allentown, PA (US); Kevin P. Yanders, Germansville, PA (US)

(73) Assignee: Advanced Tehnology Materials, Inc., Danbury, CT (US)

( * ) Notice: Subject to any disclaimer, the term of this patent is extended or adjusted under 35 U.S.C. 154(b) by 53 days.

(21) Appl. No.: 11/094,113

(22) Filed: Mar. 30, 2005

(65) Prior Publication Data

US 2006/0229221 A1 Oct. 12, 2006

(51) Int. Cl.
*C11D 3/30* (2006.01)
*C11D 1/62* (2006.01)

(52) U.S. Cl. ............ 510/178; 510/175; 510/176; 510/181; 510/504

(58) Field of Classification Search ........... 510/175, 510/176, 178, 181, 504; 134/1.2, 1.3
See application file for complete search history.

(56) References Cited

U.S. PATENT DOCUMENTS

| | | | |
|---|---|---|---|
| 4,808,513 A * | 2/1989 | Lazarus et al. ............ 430/331 |
| 5,143,648 A | 9/1992 | Satoh et al. | |
| 5,466,389 A | 11/1995 | Ilardi et al. | |
| 5,563,119 A * | 10/1996 | Ward ........................ 510/176 |
| 5,597,420 A | 1/1997 | Ward | |
| 5,709,756 A | 1/1998 | Ward | |
| 5,863,344 A | 1/1999 | Nam | |
| 6,194,366 B1 * | 2/2001 | Naghshineh et al. ........ 510/175 |
| 6,417,147 B2 * | 7/2002 | Amemiya et al. .......... 510/175 |
| 6,492,308 B1 * | 12/2002 | Naghshineh et al. ........ 510/175 |
| 2004/0220065 A1 * | 11/2004 | Hsu .......................... 510/175 |
| 2006/0016785 A1 * | 1/2006 | Egbe et al. ................... 216/83 |
| 2006/0166847 A1 * | 7/2006 | Walker et al. .............. 510/175 |
| 2007/0111912 A1 * | 5/2007 | Phenis et al. ............... 510/175 |

FOREIGN PATENT DOCUMENTS

| EP | 0 647 884 A1 | | 4/1995 |
|---|---|---|---|
| WO | 02/065538 | * | 8/2002 |
| WO | WO 02/065538 | | 8/2002 |

OTHER PUBLICATIONS

Int'l Search Report for PCT/US2006/007676 dated Jul. 12, 2006.

* cited by examiner

*Primary Examiner*—Charles I Boyer
(74) *Attorney, Agent, or Firm*—Chih-Sheng (Jason) Lin; Tristan A. Fuierer; Moore & Van Allen, PLLC

(57) ABSTRACT

A cleaning solution is provided for cleaning metal-containing microelectronic substrates, particularly for post etch, via formation and post CMP cleaning. The cleaning solution consists of a quaternary ammonium hydroxide, an organic amine, and water. A preferred cleaning solution consists of tetramethylammonium hydroxide, monoethanolamine, and water. The pH of cleaning solution is greater than 10.

14 Claims, 7 Drawing Sheets

AQUEOUS CLEANER WITH LOW METAL ETCH RATE COMPRISING ALKANOLAMINE AND TETRAALKYLAMMONIUM HYDROXIDE

FIELD OF THE INVENTION

The present invention relates to post etch and post chemical-mechanical polishing (post-CMP) cleaning operations, and more specifically to post etch and post-CMP cleaning solutions for metal-containing microelectronic substrates.

BACKGROUND OF THE INVENTION

The present day fabrication of semiconductor devices is a complex, multi-step process. The CMP process and post etch processes are now well established enabling technology used by most advanced semiconductor operations for manufacturing of semi-conductor devices with design geometries less than 0.35 micron.

The CMP processes involve holding and rotating a thin, flat substrate of the semiconductor material against a wetted polishing surface under controlled chemical, pressure and temperature conditions. A chemical slurry containing a polishing agent, such as alumina or silica, is used as the abrasive material. In addition, the chemical slurry contains selected chemicals which etch various surfaces of the substrate during processing. The combination of mechanical and chemical removal of material during polishing results in superior planarization of the surface.

The CMP process, however, leaves contamination on the surfaces of the semiconductor substrate. This contamination is comprised of abrasive particles from the polishing slurry which may consist of alumina or silica, with reactive chemicals added to the polishing slurry. In addition, the contaminant layer may comprise reaction products of the polishing slurry and the polished surfaces. It is necessary to remove the contamination prior to subsequent processing of the semiconductor substrate in order to avoid degradation in device reliability and to avoid the introduction of defects which reduce the manufacturing process yield. Thus, post-CMP cleaning solutions have been developed to cleanse the substrate surface of CMP residuum.

Alkaline solutions based on ammonium hydroxide have been traditionally used in post-CMP cleaning applications. A majority of CMP applications have been directed to aluminum, tungsten, tantalum, and oxide-containing surfaces.

Copper is increasingly becoming a material of choice in the production of interconnects in semiconductor fabrication. Copper is replacing aluminum as the metal of choice in such fabrication. There are several post-CMP processes for cleaning surfaces containing copper. Copper, copper oxide, and the slurry particles are the contaminants that exist on the copper-containing surface following this CMP process. The copper surface contamination diffuses quickly in silicon and silicon dioxide, and therefore, it must be removed from all wafer surfaces to prevent device failure.

Effective post-CMP cleaning solutions are disclosed and claimed in U.S. Pat. No. 6,194,366 B1 now owned by the Assignee of the present application. Patentees disclose a cleaning composition containing tetramethyl-ammonium hydroxide (TMAH), monoethanol amine (MEA), a corrosion inhibitor being one of gallic acid ascorbic acid or mixtures thereof and water. The basic composition can be used in a dilute form for effective Post CMP cleaning.

Nam, U.S. Pat. No. 5,863,344, discloses a cleaning solution for semiconductor devices containing tetramethyl ammonium hydroxide, acetic acid, and water. The solution preferably contains a volumetric ratio of acetic acid to tetramethyl ammonium hydroxide ranging from about 1 to about 50.

Ward, U.S. Pat. No. 5,597,420, discloses a post etch aqueous stripping composition useful for cleaning organic and inorganic compounds from a substrate that will not corrode or dissolve metal circuitry in the substrate. The disclosed aqueous composition contains preferably 70 to 95 wt % monoethanolamine and a corrosion inhibitor at about 5 wt % such as catechol, pyrogallol or gallic acid.

Ward, U.S. Pat. No. 5,709,756, discloses a post etch cleaning composition containing about 25 to 48 wt % hydroxylamine, 1 to 20 wt % ammonium fluoride, and water. The pH of the solution is greater than 8. The solution may further contain a corrosion inhibitor such as gallic acid, catechol, or pyrogallol.

Ilardi et al., U.S. Pat. No. 5,466,389, discloses an aqueous alkaline cleaning solution for cleaning microelectronic substrates. The cleaning solution contains a metal ion-free alkaline component such as a quaternary ammonium hydroxide (up to 25 wt %), a nonionic surfactant (up to 5 wt %), and a pH-adjusting component, such as acetic acid, to control the pH within the range of 8 to 10.

Schwartzkopf et al., European Patent No. 0647884A1 discloses photoresist strippers containing reducing agents to reduce metal corrosion. This patent teaches the use of ascorbic acid, gallic acid, and pyrogallol among others for the control of metal corrosion in alkali containing components.

U.S. Pat. No. 5,143,648 to Satoh et al., which is herein incorporated by reference discloses novel ascorbic acid derivatives as antioxidants.

Ward U.S. Pat. No. 5,563,119 discloses a post etch aqueous stripping composition consisting of an alkanolamine, tetraalkyammonium hydroxide, and a corrosion inhibitor for cleaning organic residue from aluminized inorganic substrates.

From the above noted prior art and general knowledge of workers skilled in the art cleaning compositions known prior to the invention described below required a corrosion inhibitor. Furthermore, in view of the fact that since alkanolamine and a quaternary ammonium hydroxide in combination are each considered corrosive toward most metals, a combination of these two compounds would not be considered by a worker skilled in the art looking for new metal cleaning compositions.

There is a need to further improve post-CMP cleaning compositions for copper-containing surfaces to not only clean residuals particles and contaminants from surfaces of devices but to further prevent or substantially lessen corrosion of the copper-containing substrate. Such a post-CMP cleaning composition must also refrain from attacking the process equipment used in the post-CMP process. Such a post-CMP cleaning composition should also be economical, work effectively through a wide temperature range, and preferably contain chemical components of comparatively lower toxicity. Such a post-CMP cleaning composition should also be useful in cleaning operations following CMP processes utilizing alumina or silica-based slurries.

SUMMARY OF THE INVENTION

In one aspect the present invention is a cleaning solution for cleaning metal-containing microelectronic substrates consisting of 0.09 to 22% by weight alkanolamine, 0.02 to 13.5% by weight quaternary ammonium hydroxide, balance deionized water. The pH of the solution should be greater than 10.

In another aspect the present invention is a post-CMP cleaning solution for cleaning microelectronic substrates consisting of 0.09 to 22 wt % of an alkanolamine selected from the group consisting of monoethanolamine, 1, amino-2-propanol, 2-(methylamino) ethanol, triethanolamine and mixtures thereof, a quaternary ammonium hydroxide selected from the group consisting of tetramethylammonium hydroxide, tetrabutyl ammonium hydroxide and mixtures thereof in an amount in the range from about 0.02 wt % to about 13.5 wt %, balance deionized water.

In yet another aspect the present invention is a cleaning composition containing 9.0 wt % to 22.0 wt % alkanolamine, 0.45 wt % to 12.2 wt % quaternary ammonium hydroxide, balance deionized water.

In still another embodiment the present invention is a cleaning composition consisting essentially of 0.30 to 0.70 wt % alkanolamine 0.02 to 0.7 wt % quaternary ammonium hydroxide, balance deionized water.

In a further embodiment the present invention is a cleaning composition consisting essentially of 0.30 to 9.0 wt % alkanolamine, 0.06 to 13.5 wt % potassium hydroxide, balance deionized water.

DETAILED DESCRIPTION OF THE INVENTION

Figure 1:
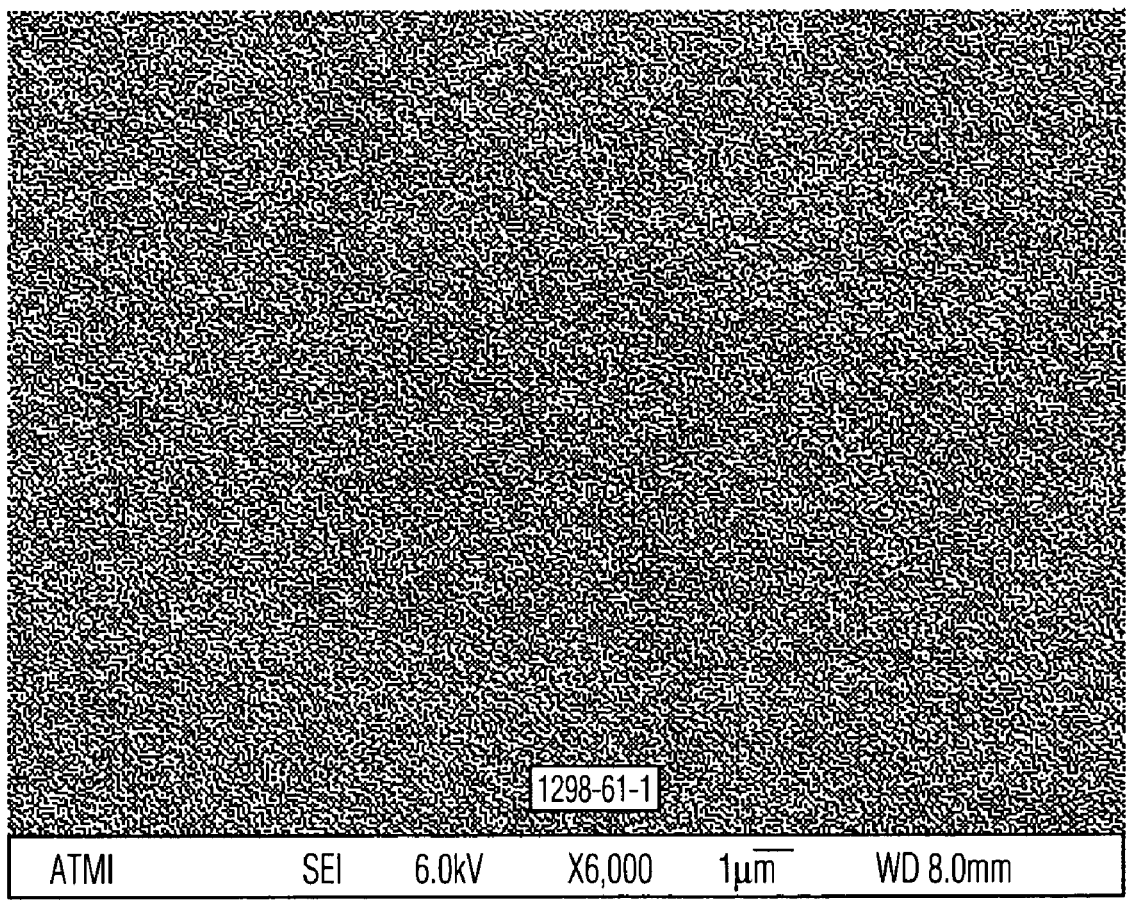
FIG. 1 is a scanning electron microscope (SEM) photomicrograph of a wafer prepared with an aggressive cleaning composition according to the invention.

Cleaning metal-containing substrates following CMP processing are generally referred to as "post-Cu CMP" or "post-CMP copper clean". A "copper-containing microelectronic substrate" is understood herein to refer to a substrate surface manufactured for use in microelectronic, integrated circuit, or computer chip applications, wherein the substrate contains copper-containing components. Copper-containing components may include, for example, metallic interconnects that are predominately copper or a copper alloy. It is understood that the microelectronic surface may also be composed of semiconductor materials, such as AL, W, TiN, Ta, TiW (as copper diffusion barrier metals), and silica.

Generally, a copper-containing microelectronic substrate contains about 1-20% Cu, including the copper interconnects.

The cleaning solution of the invention may find application for any cleaning operation during the fabrication of microelectronic substrates, such as semiconductor wafers. Most notably, such cleaning applications include post-Via formations and post-CMP processes. The fabrication of conventional semiconductor wafers entails many steps requiring planarization, followed by the removal of residual product from the planarization process.

The cleaning solution of the invention comprises quaternary ammonium hydroxide, an amine, and the balance deionized water.

The pH of a cleaning solution of the invention is greater than 10.

The constituents of the cleaning solutions of the invention may be mixed together in any order. The order of addition is exemplified with respect to the embodiment containing TMAH, MEA, and deionized water. In a preferred method of preparation, 100% of the water in the final solution is added to all of the MEA. The TMAH is then added and the composition mixed under low shear-stress conditions for about 10 minutes. The resulting mixture is then filtered through a 0.1 micron filter.

The components of the preferred embodiment of a cleaning solution of the invention are commercially available.

An important feature of the cleaning solutions of the invention is that only two non-aqueous constituents (the constituents other than water) are present in the solution.

The compositions of invention consist of a quaternary ammonium hydroxide in an amount in the range from about 0.02 to about 13.5 wt %, an alkanolamine in an amount in the range from about 0.3 to about 22.0 wt %, and the balance water (preferably deionized water).

The compositions of the invention preferably use one or a mixture of tetramethylammonium hydroxide (TMAH) or tetrabutylammonium hydroxide (TBAH) as the quaternary ammonium hydroxide. The alkanolamine is preferably monoethanolamine (MEA) 1-amino-2-propanol (1A2P), 2-(methylamino) ethanol triethanolamine (TEA) and mixtures thereof.

The cleaning solutions of the invention may be employed for cleaning microelectronic substrates at temperatures ranging from ambient conditions to about 70° C. It is generally recognized that cleaning improves as temperature increases. At temperatures greater than about 70° C., evaporation of constituent cleaning solution species may adversely alter the chemistry of the cleaning system over time in a process open to ambient conditions.

The cleaning solutions of the invention, as noted, have a pH greater than 10. More preferably, the pH of cleaning solutions of the invention is maintained in the range from about 11.0 to about 12.2. A pH greater than 10 is necessary to obtain a negative zeta potential on the surface of the substrate and to avoid redeposition of the remaining particulates during the cleaning operation.

The cleaning solutions of the invention meet generally accepted industry cleaning performance standards for post-CMP applications. A common industrial cleaning target is a particle count on the substrate wafer of less than 20-particles greater than 0.2 microns in size for a 200 mm wafer, with a 5 mm edge exclusion.

The cleaning solutions of the invention limit copper corrosion to smoothing of the surface and do not damage processing equipment.

The cleaning solutions of the invention may be used with a large variety of conventional cleaning tools, including Verteq single wafer megasonic Goldfinger, OnTrak systems, DDS (double-sided scrubbers) and Megasonic batch wet bench systems.

The cleaning solutions of the invention may be used successfully on surfaces containing copper, tungsten, and/or silica.

Via cleaning is one application of the cleaning solution of the invention. Vias are holes etched in microelectronic substrates to provide a conduit for connecting metal layers. Vias are formed by etching the substrate surface with a gaseous etchant forms vias. The substrate is commonly a dielectric material, such as Fluorinated Silica Glass (FSG). The residue remaining on the substrate surface and via walls must be removed following the etching process. The residue is often referred to as "side wall polymer", as it is also found on the vertical walls of the via. Etching residue may also be located at the bottom of the via, on top of the metal. The cleaning solution of the invention does not react with or affect the exposed dielectric material.

A series of tests were conducted to determine whether compositions according to the invention while being effective cleaning compositions could cause un-wanted and/or excessive corrosion of copper used in fabricating microelectronic devices.

The following examples summarize the data. In the data presented in Tables 1, 2 and 3 the left hand column lists the amine plus deionized water composition and the resulting copper concentration while the right hand column shows the data for the amine and water to which is added quaternary ammonium hydroxide.

EXAMPLE 1

Cleaning solutions were evaluated for the tendency to corrode copper. One hundred milliliter aqueous solutions of alkanolamines with and without added quaternary ammonium hydroxides were prepared. Identical (4×0.02) inch copper wire samples were placed into these solutions for 10 minutes at 22° C., the wire was removed, and the solutions analyzed for copper (in parts per billion) using graphite furnace atomic absorption spectroscopy. The results, set forth in Table 1, clearly show the ability of quaternary ammonium hydroxides to prevent or moderate the copper corrosion (as measured by copper uptake in the cleaning solutions) that accompanies exposure to alkanolamines. Relative copper corrosion rate=(copper content of formulation with quaternary ammonium hydroxide)÷(copper content of formulation without quaternary ammonium hydroxide).

TABLE 1

Effect of Quaternary Ammonium Hydroxides on Alkanolamine Cleaners

| Comparative Alkanolamine Solutions without Quaternary Ammonium Hydroxides | | | Alkanolamine Formulation Containing Quaternary Ammonium Hydroxide | | | |
| --- | --- | --- | --- | --- | --- | --- |
| Alkanolamine | wt. % | Copper Content (ppb) | Quaternary Ammonium Hydroxide | wt. % | Copper Content (ppb) | Relative Corrosion Rate |
| Monoethanolamine | 9 | 505 | Tetramethyl | 0.45 | 455 | 0.9 |
| Monoethanolamine | 9 | | Tetramethyl | 1.8 | 380 | 0.8 |
| Monoethanolamine | 9 | | Tetramethyl | 5 | 290 | 0.6 |
| Monoethanolamine | 9 | | Tetramethyl | 9 | 80 | 0.2 |
| 1-Amino-2-propanol | 11 | 588 | Tetramethyl | 1.1 | 613 | 1.0 |
| 1-Amino-2-propanol | 11 | | Tetramethyl | 2.2 | 409 | 0.7 |
| 1-Amino-2-propanol | 11 | | Tetramethyl | 3.7 | 480 | 0.8 |
| 1-Amino-2-propanol | 11 | | Tetramethyl | 6.1 | 404 | 0.7 |
| 1-Amino-2-propanol | 11 | | Tetramethyl | 11.0 | 287 | 0.5 |
| 2-(Methylamino)ethanol | 11 | 344 | Tetrabutyl | 0.6 | 225 | 0.6 |
| 2-(Methylamino)ethanol | 11 | | Tetrabutyl | 1.1 | 212 | 0.6 |
| 2-(Methylamino)ethanol | 11 | | Tetrabutyl | 2.2 | 149 | 0.4 |
| 2-(Methylamino)ethanol | 11 | | Tetrabutyl | 3.7 | 133 | 0.4 |
| 2-(Methylamino)ethanol | 11 | | Tetrabutyl | 6.1 | 110 | 0.3 |
| 2-(Methylamino)ethanol | 11 | | Tetrabutyl | 11 | 28 | 0.08 |
| Triethanolamine | 22 | 190 | Tetramethyl | 1.1 | 46 | 0.2 |
| Triethanolamine | 22 | | Tetramethyl | 2.2 | 0 | 0 |
| Triethanolamine | 22 | | Tetramethyl | 4.4 | 0 | 0 |
| Triethanolamine | 22 | | Tetramethyl | 7.3 | 0 | 0 |
| Triethanolamine | 22 | | Tetramethyl | 12.2 | 0 | 0 |

EXAMPLE 2

Cleaning solutions were evaluated for the tendency to corrode copper. Aqueous solutions of alkanolamines with and without added quaternary ammonium hydroxides were prepared. Identical blanket copper on silicon wafer pieces were submersed in these stirred solutions for 10 minutes at 22° C. Four point probe measurements for sheet resistance were made on these pieces prior to and after treatment. Copper etch rates (in Angstroms per minute) for the solutions were calculated. The results, set forth in Table 2, clearly show the ability of quaternary ammonium hydroxides to prevent or moderate the copper corrosion (as measured by copper etch rate) that accompanies exposure to alkanolamines. Relative copper corrosion rate=(copper etch rate of formulation with quaternary ammonium hydroxide) ÷(copper etch rate of formulation without quaternary ammonium hydroxide).

TABLE 2

Effect of Quaternary Ammonium Hydroxides on Alkanolamine Cleaners

| | Comparative Alkanolamine Solutions without Quaternary Ammonium Hydroxides | | Alkanolamine Formulation Containing Quaternary Ammonium Hydroxide | | | |
|---|---|---|---|---|---|---|
| Alkanolamine | wt. % | Copper Etch rate (A/min.) | Quaternary Ammonium Hydroxide | wt. % | Copper Etch rate (A/min.) | Relative Corrosion Rate |
| Monoethanolamine | 9 | 9.8 | Tetramethyl | 0.45 | 9.8 | 1.0 |
| Monoethanolamine | 9 | | Tetramethyl | 1.8 | 8.9 | 0.9 |
| Monoethanolamine | 9 | | Tetramethyl | 5 | 6.8 | 0.7 |
| Monoethanolamine | 9 | | Tetramethyl | 9 | 5.2 | 0.5 |
| Monoethanolamine | 9 | | Tetramethyl | 13.5 | 4.8 | 0.5 |
| Monoethanolamine | 9 | 9.8 | Tetrabutyl | 0.9 | 10.0 | 1.0 |
| Monoethanolamine | 9 | | Tetrabutyl | 5 | 9.7 | 1.0 |
| Monoethanolamine | 9 | | Tetrabutyl | 13.5 | 5.7 | 0.6 |
| Monoethanolamine | 9 | | Tetrabutyl | 23.3 | 4.4 | 0.4 |
| Monoethanolamine | 9 | | Tetrabutyl | 41.4 | 4.2 | 0.4 |
| 1-Amino-2-propanol | 11 | 7.7 | Tetramethyl | 1.1 | 7.4 | 1.0 |
| 1-Amino-2-propanol | 11 | | Tetramethyl | 2.2 | 7.5 | 1.0 |
| 1-Amino-2-propanol | 11 | | Tetramethyl | 6.1 | 6.9 | 0.9 |
| 1-Amino-2-propanol | 11 | | Tetramethyl | 11.0 | 5.1 | 0.7 |
| 2-(Methylamino)ethanol | 11 | 9.0 | Tetramethyl | 1.1 | 7.8 | 0.9 |
| 2-(Methylamino)ethanol | 11 | | Tetramethyl | 2.2 | 7.0 | 0.8 |
| 2-(Methylamino)ethanol | 11 | | Tetramethyl | 6.1 | 6.5 | 0.7 |
| 2-(Methylamino)ethanol | 11 | | Tetramethyl | 11 | 6.8 | 0.7 |
| Triethanolamine | 22 | 5.1 | Tetramethyl | 2.2 | 5.4 | 1.0 |
| Triethanolamine | 22 | | Tetramethyl | 4.4 | 4.7 | 0.9 |
| Triethanolamine | 22 | | Tetramethyl | 12.2 | 3.4 | 0.7 |

EXAMPLE 3

Cleaning solutions were evaluated for the ability to remove particles from wafers patterned with copper into a low-K organosilicon dielectric. These received a final copper chemical mechanical polish (CMP) using a Hitachi low pH barrier slurry followed by drying without post-CMP cleaning. Aqueous solutions of alkanolamines with and without added quaternary ammonium hydroxides similar to Examples 1 and 2 were prepared and diluted 30:1 with water. These diluted solutions were used to clean pieces of the dirty wafers described above. A single wafer spray tool operating at 150 rpm at room temperature for 60 seconds was used. Particle counts of 20×20 micron squares were obtained from scanning electron microscope images using the Object Count routine of Sigma Scan Pro software. The results, set forth in Table 3, clearly show the ability of quaternary ammonium hydroxides to enhance the particle removing ability of the alkanolamine solutions. Relative particle count=(particle count of formulation with quaternary ammonium hydroxide)÷(particle count of formulation without quaternary ammonium hydroxide).

TABLE 3

Effect of Quaternary Ammonium Hydroxides on Alkanolamine Cleaners

| | Comparative Alkanolamine Solutions without Quaternary Ammonium Hydroxides | | Alkanolamine Formulation Containing Quaternary Ammonium Hydroxide | | | |
|---|---|---|---|---|---|---|
| Alkanolamine | wt. % | Particle Count | Quaternary Ammonium Hydroxide | wt. % | Particle Count | Relative Particle Count |
| Monoethanolamine | 0.3 | 14,400 | Tetramethyl | 0.02 | 5000 | 0.3 |
| Monoethanolamine | 0.3 | | Tetramethyl | 0.03 | 860 | 0.06 |
| Monoethanolamine | 0.3 | | Tetramethyl | 0.1 | 260 | 0.02 |
| Monoethanolamine | 0.3 | | Tetramethyl | 0.2 | 260 | 0.02 |
| Monoethanolamine | 0.3 | | Tetramethyl | 0.3 | 190 | 0.01 |
| 1-Amino-2-propanol | 0.4 | 19,900 | Tetramethyl | 0.004 | 3400 | 0.2 |
| 1-Amino-2-propanol | 0.4 | | Tetramethyl | 0.01 | 1700 | 0.09 |
| 1-Amino-2-propanol | 0.4 | | Tetramethyl | 0.04 | 1800 | 0.09 |
| 1-Amino-2-propanol | 0.4 | | Tetramethyl | 0.07 | 660 | 0.03 |
| 2-(Methylamino)ethanol | 0.4 | 3,800 | Tetramethyl | 0.004 | 2400 | 0.6 |
| 2-(Methylamino)ethanol | 0.4 | | Tetramethyl | 0.01 | 2200 | 0.6 |
| 2-(Methylamino)ethanol | 0.4 | | Tetramethyl | 0.07 | 880 | 0.2 |
| 2-(Methylamino)ethanol | 0.4 | | Tetramethyl | 0.2 | 100 | 0.03 |

TABLE 3-continued

Effect of Quaternary Ammonium Hydroxides on Alkanolamine Cleaners

| Comparative Alkanolamine Solutions without Quaternary Ammonium Hydroxides | | | Alkanolamine Formulation Containing Quaternary Ammonium Hydroxide | | | |
|---|---|---|---|---|---|---|
| Alkanolamine | wt. % | Particle Count | Quaternary Ammonium Hydroxide | wt. % | Particle Count | Relative Particle Count |
| Triethanolamine | 0.7 | 28,000 | Tetramethyl | 0.04 | 8400 | 0.3 |
| Triethanolamine | 0.7 |  | Tetramethyl | 0.07 | 6100 | 0.2 |
| Triethanolamine | 0.7 |  | Tetramethyl | 0.1 | 5300 | 0.2 |
| Triethanolamine | 0.7 |  | Tetramethyl | 0.2 | 5200 | 0.2 |

EXAMPLE 4

The usefulness of adding quaternary ammonium hydroxides to alkanolamine cleaning solutions was further demonstrated by comparing a quaternary ammonium hydroxide containing formulation to aqueous alkanolamine with and without an added known copper corrosion inhibitor, 1,2,4-triazole. Aqueous cleaning solutions were prepared for comparison and are listed in Table 4. These were evaluated for the ability to remove particles from wafers patterned with copper into a low-K organosilicon dielectric using the method described in Example 3. Additional (unpatterned) blanket copper wafer pieces were cleaned using these solutions under the same conditions, a single wafer spray tool operating at 150 rpm at room temperature for 60 seconds. After cleaning, surface roughness was evaluated using an atomic force microscope and the root mean square (Rms) roughness (in nanometers) of a 20×20 micron square determined. The results, set forth in Table 4, clearly show that quaternary ammonium hydroxide addition results in enhanced the particle removal and lower surface roughness than aqueous alkanolamine with or without the copper corrosion inhibitor.

TABLE 4

Comparison of Quaternary Ammonium Hydroxide and 1,2,4-Triazole

| Treatment Solution | Particle Count | Rms Roughness (nm) |
|---|---|---|
| None | 27,300 | 2.8 |
| Monoethanolamine (0.3%) | 10,500 | 2.7 |
| Monoethanolamine (0.3%) 1,2,4-Triazole (0.003%) | 380 | 2.9 |
| Monoethanolamine (0.3%) Tetramethylammonium hydroxide (0.1%) | 200 | 1.7 |

EXAMPLE 5

The utility of quaternary ammonium hydroxide-containing alkanolamine cleaning solutions was further demonstrated by using such a solution to strip a typical photoresist and anti-reflective coating (ARC) on a copper substrate. The test wafer was prepared by spin coating 0.2 micron of Brewer Science bottom-ARC #XL-20 onto a copper layer that had been deposited on a silicon wafer. The ARC was cured by baking at 190° C. followed by further spin coating with four microns of Shipley SPR-220 photoresist. The photoresist was then cured by baking at 140° C. followed by a one minute deep UV cure at the same temperature. Pieces of this wafer were stripped using a mixture of 92% monoethanolamine, 2% tetramethylammonium hydroxide, and 6% water under the following process conditions.

Figure 2:
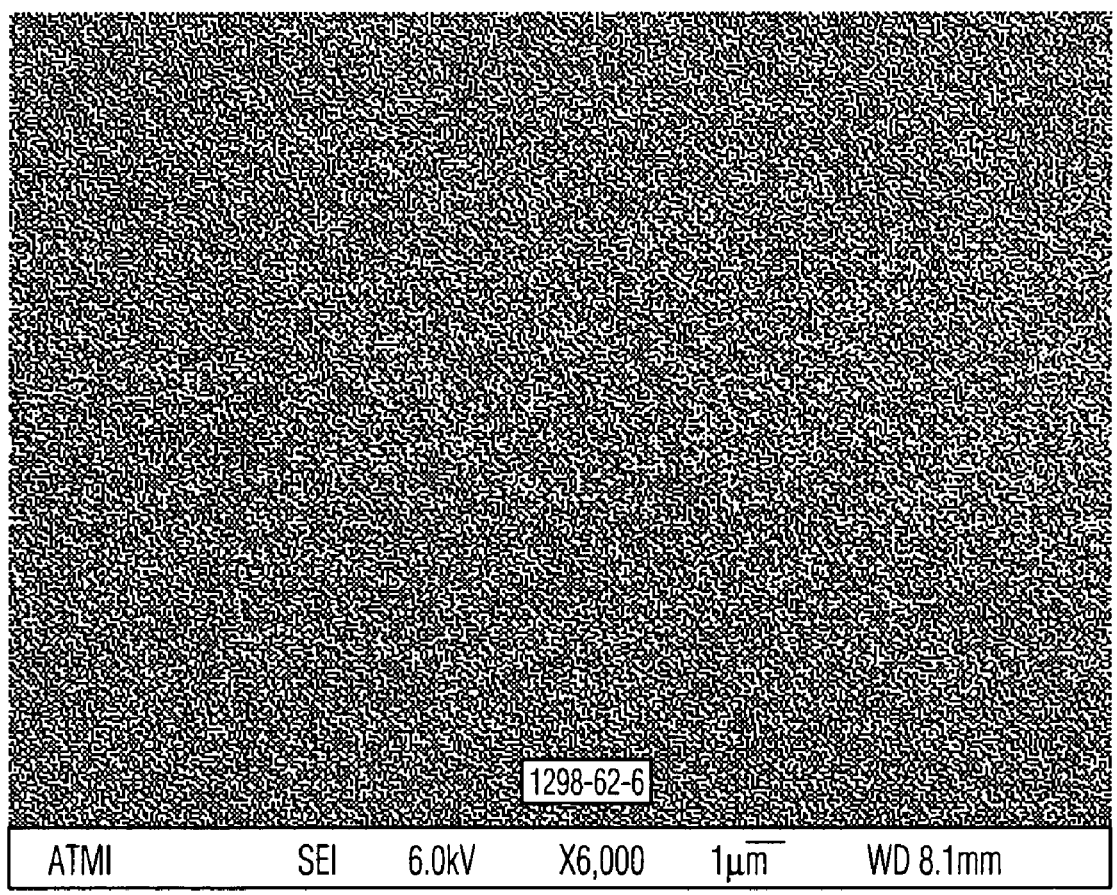
FIG. 2 is a scanning electron microscope (SEM) photomicrograph of a wafer cleaned in a less aggressive composition according to the present invention.

| Run Number | Temperature (° C.) | Time (minutes) | SEMs |
|---|---|---|---|
| 1 | 70 | 30 | FIG. 1 |
| 2 | 70 | 10 |  |
| 3 | 70 | 5 |  |
| 4 | 55 | 10 |  |
| 5 | 55 | 5 |  |
| 6 | 40 | 10 |  |
| 7 | 40 | 5 | FIG. 2 |

Scanning electron micrographs (SEM) were obtained for each wafer piece treated. These micrographs indicated that for every run listed above, the ARC and photoresist were completely removed without any damage to the underlying copper surface. FIG. 1 illustrates the absence of any damage to the copper surface using most aggressive treatment. Further evidence of copper compatibility was obtained by measuring the copper etch rate of the formulation prepared above using the sheet resistance method described in Example 2. A copper etch rate of 4.3 Angstroms/minute at 70° C. was obtained which is similar to the improved etch rates reported for the formulations described in Example 2. FIG. 2 illustrates the complete removal of ARC and photoresist using the least aggressive treatment.

EXAMPLE 6

The utility of quaternary ammonium hydroxide-containing alkanolamine cleaning solutions was further demonstrated by stripping wafer pieces described in Example 5 using a mixture of 92% 2-(2-dimethylaminoethoxy)ethanol, 2% tetramethylammonium hydroxide, and 6% water under the following process

Figure 3:
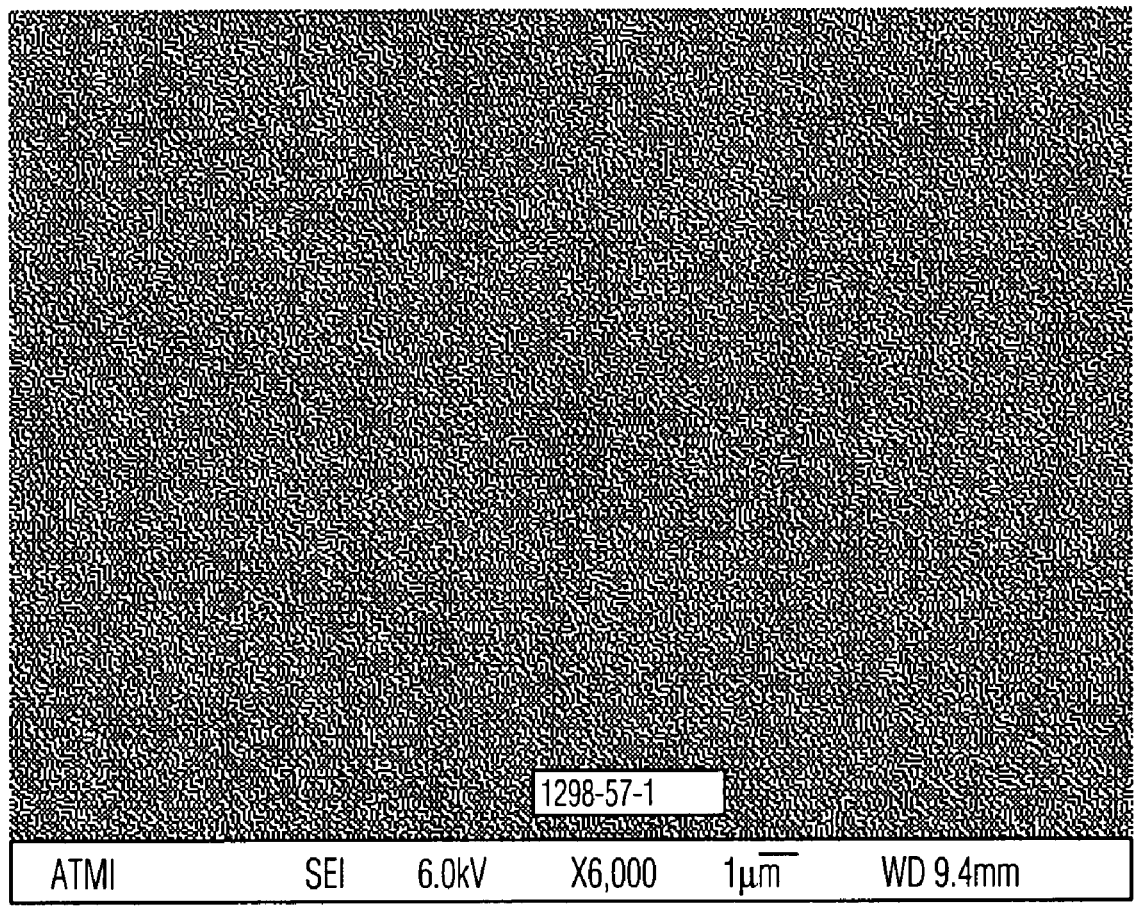
FIG. 3 is a SEM photomicrograph of the device shown in FIG. 1 treated to strip photoresist with an aggressive composition according to the invention.

| Run Number | Temperature (° C.) | Time (minutes) | SEMs |
|---|---|---|---|
| 1 | 70 | 60 | FIG. 3 |
| 2 | 70 | 30 |  |
| 3 | 70 | 15 |  |
| 4 | 70 | 5 |  |
| 5 | 60 | 30 |  |
| 6 | 60 | 15 |  |
| 7 | 60 | 5 |  |
| 8 | 50 | 30 |  |

-continued

Figure 4:
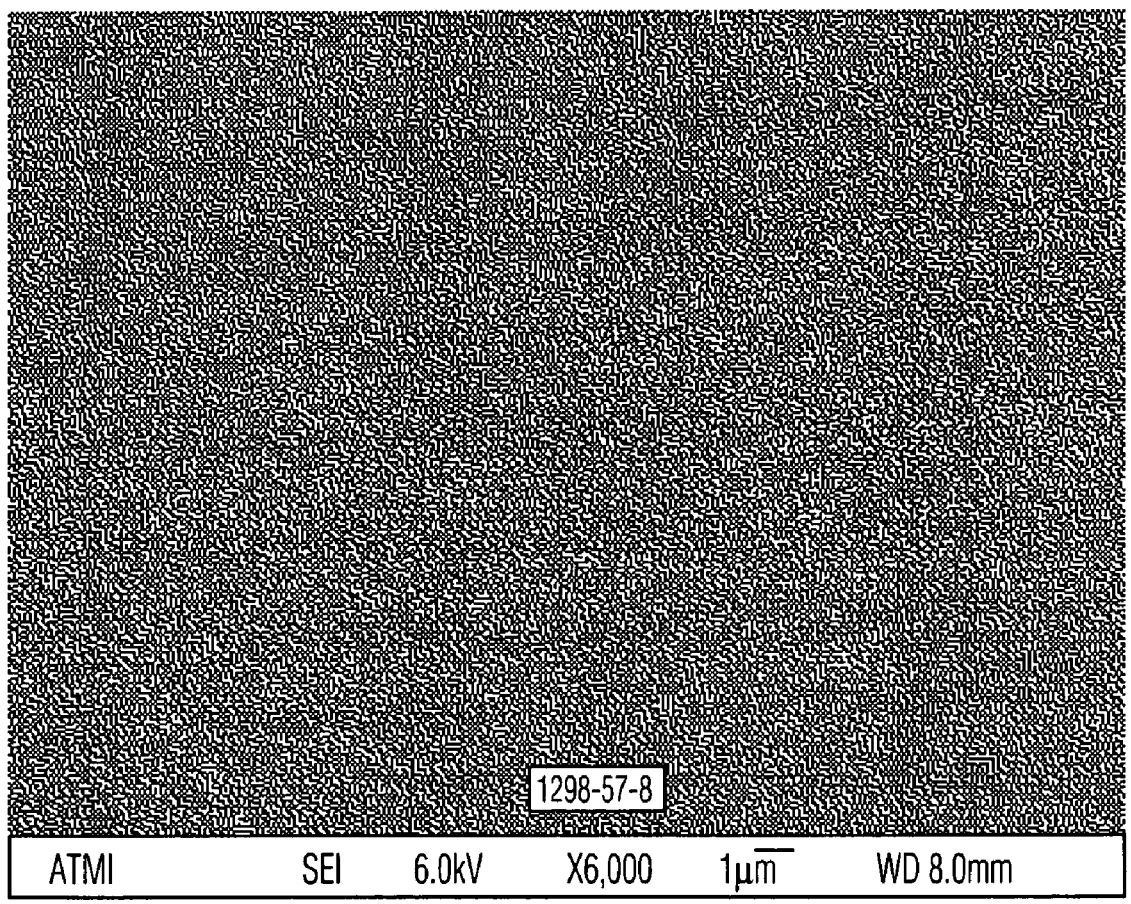
FIG. 4 is a SEM photomicrograph of a device shown in FIG. 1 treated to strip photoresist with a less aggressive composition according to the invention.

| Run Number | Temperature (° C.) | Time (minutes) | SEMs |
|---|---|---|---|
| 9 | 50 | 15 | FIG. 4 |
| 10 | 50 | 5 | |

Scanning electron photomicrographs (SEMs) were obtained for each wafer piece treated. These micrographs indicated that for every run listed above, the ARC and photoresist were completely removed without any damage to the underlying copper surface. FIG. 3 illustrates the absence of any damage to the copper surface using the most aggressive treatment. Further evidence of copper compatibility was obtained by measuring the copper etch rate of the formulation prepared above using the sheet resistance method described in Example 2. A favorably low copper etch rate of 2.4 Angstroms/minute at 70° C. was obtained. FIG. 4 illustrates the complete removal of ARC and photoresist using a much less aggressive treatment.

It has also been discovered that potassium hydroxide is an effective alternate to the quaternary ammonium hydroxide for use in an effective cleaning solution. Examples 7 and 8 set out below summarize data for compositions using an amine, (e.g. MEA), potassium hydroxide (KOH) and deionized water.

EXAMPLE 7

Cleaning solutions were evaluated for the tendency to corrode copper. Aqueous solutions of an alkanolamine with and without added potassium hydroxide were prepared and evaluated using the method of Example 2. The results, set forth in Table 7, clearly show the ability of potassium hydroxide to prevent or moderate the copper corrosion (as measured by copper etch rate) that accompanies exposure to alkanolamines. Relative copper corrosion rate=(copper etch rate of formulation with potassium hydroxide)÷(copper etch rate of formulation without potassium hydroxide).

TABLE 7

Effect of Potassium Hydroxide on Alkanolamine Cleaners

| | Comparative Alkanolamine Solution without Potassium Hydroxide | | Alkanolamine Formulation Containing Potassium Hydroxide | | |
|---|---|---|---|---|---|
| Alkanolamine | wt. % | Copper Etch rate (A/min.) | Potassium Hydroxide wt. % | Copper Etch rate (A/min.) | Relative Corrosion Rate |
| Monoethanolamine | 9 | 9.8 | 1.8 | 7.9 | 0.8 |
| Monoethanolamine | 9 | | 5 | 6.5 | 0.7 |
| Monoethanolamine | 9 | | 9 | 6.6 | 0.7 |
| Monoethanolamine | 9 | | 13.5 | 5.1 | 0.5 |

EXAMPLE 8

The usefulness of adding potassium hydroxide to alkanolamine cleaning solutions was further demonstrated by comparing a potassium hydroxide containing formulations to aqueous alkanolamines with no added potassium hydroxide. Aqueous cleaning solutions were prepared for comparison and are listed in Table 8. These were evaluated for the ability to remove particles from wafers patterned with copper into a low-κ organosilicon dielectric using the method described in Example 3. The results, set forth in Table 8, clearly show that potassium hydroxide addition results in enhanced the particle removal.

TABLE 8

| Treatment Solution | Particle Count |
|---|---|
| None | 27,300 |
| Monoethanolamine (0.3%) | 10,500 |
| Monoethanolamine (0.3%) Potassium hydroxide (0.06%) | 910 |
| Monoethanolamine (0.1%) Potassium hydroxide (0.06%) | 80 |

The foregoing examples illustrate the low corrosion rate and effective cleaning properties of compositions according to the invention.

Additional short-loop patterned test wafers containing organosilicon glass (OSG) patterns on ECD copper and blanket ECD copper wafers were used in testing of the composition of the invention.

Figure 5:
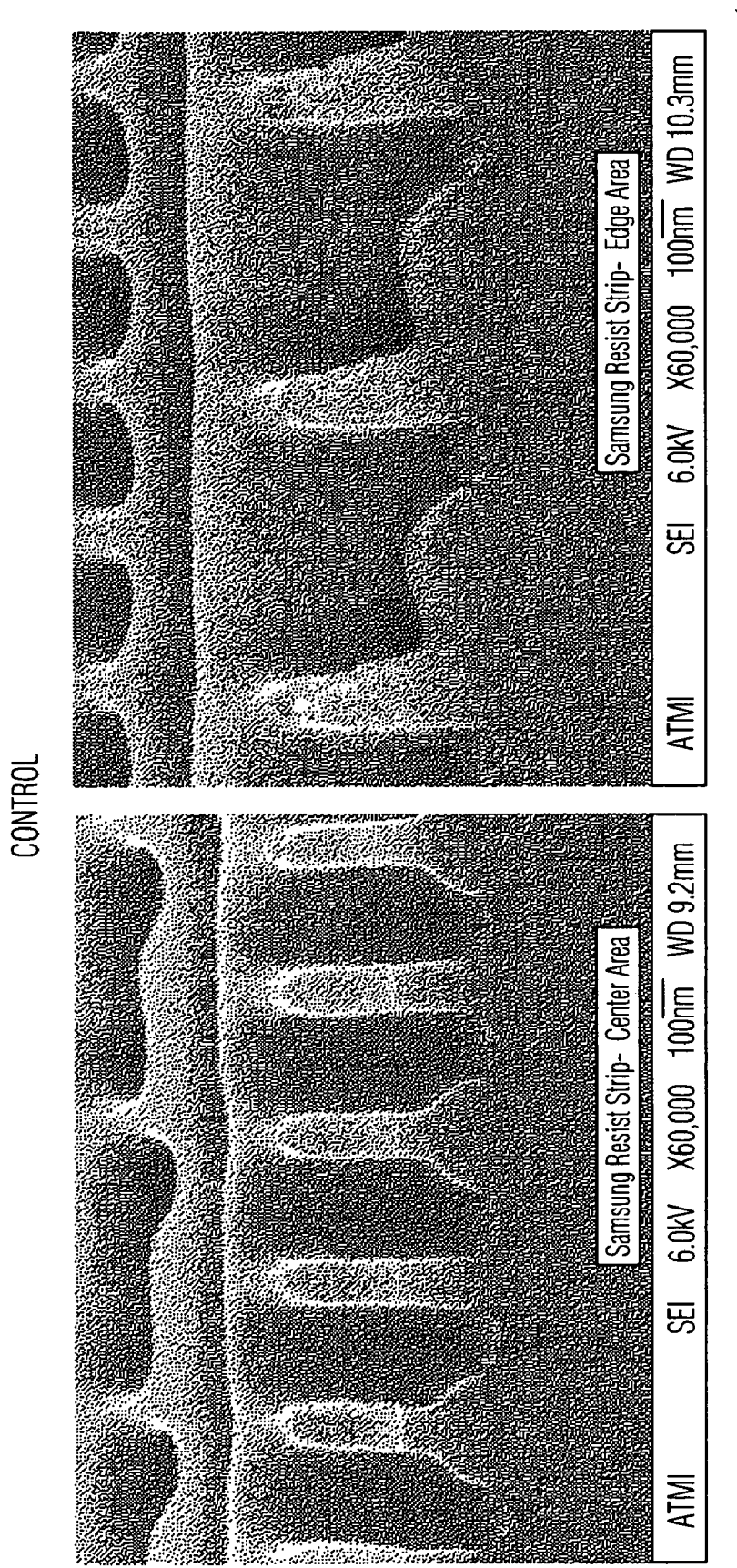
FIG. 5 is a pair of SEM photomicrographs of a patterned wafer before treatment with a composition according to the invention.
Figure 6:
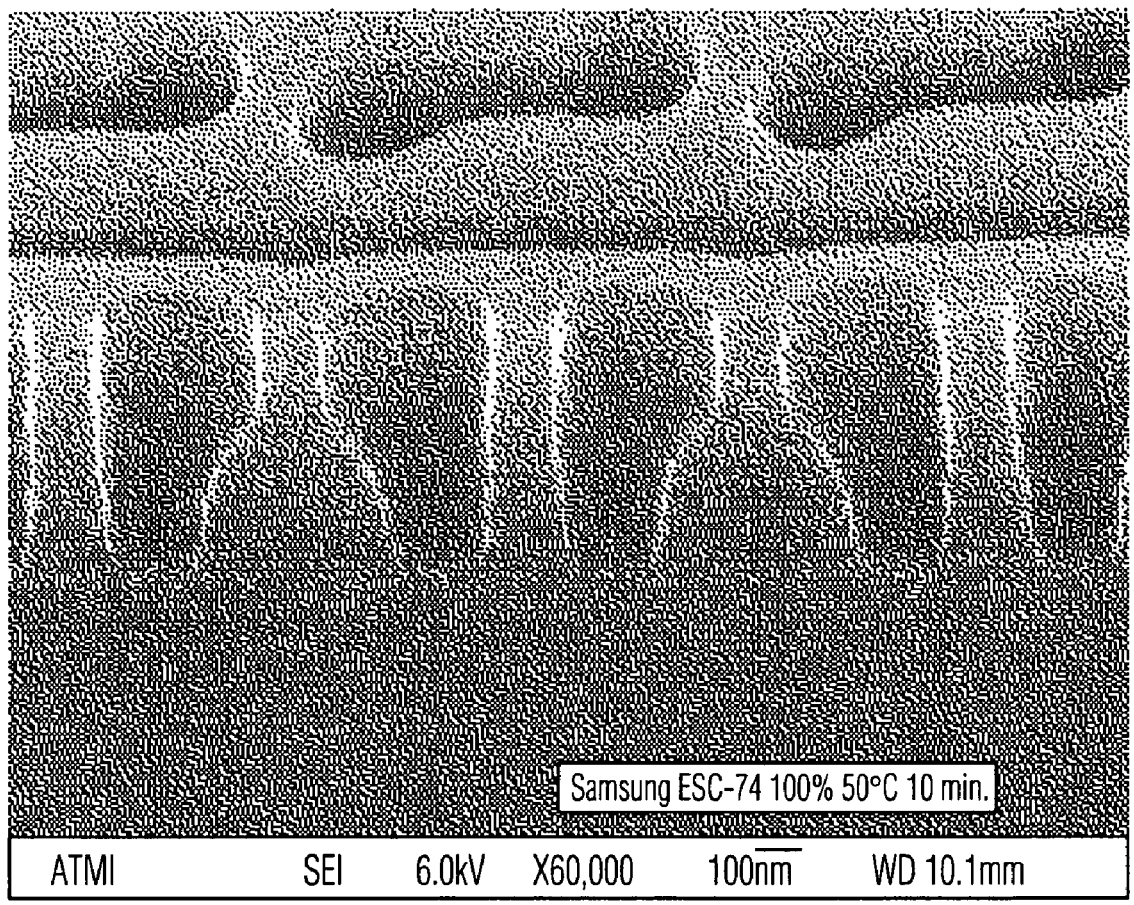
FIG. 6 is a SEM photomicrograph of post etch short-looped patterned wafer segments after treatment with a composition according to the present invention.
Figure 7:
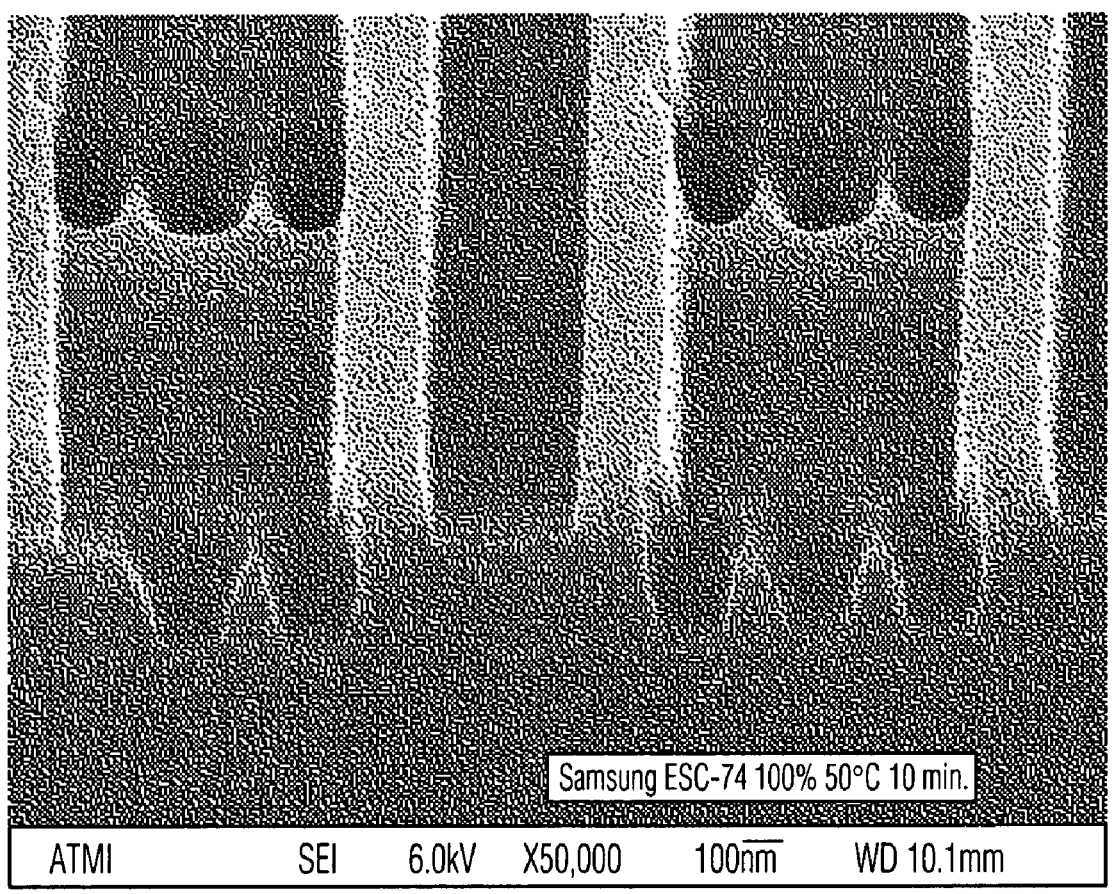
FIG. 7 is a SEM photomicrograph of another portion of the device of FIG. 6 treated post etch with a composition according to the invention.

A composition containing 9.0 wt % MEA, 5% TMAH, balance deionized water was used to clean a post etch device. FIG. 5 is a pair of photomicrographs of the device prior to being exposed to the cleaning composition. FIG. 6 and FIG. 7 are photomicrographs of the device of FIG. 5 after exposure to the cleaning composition for 10 minutes at 50° C.

In addition to copper, other metals have and will be used in the manufacture of microelectronic devices. Metals such as aluminum and tungsten would be exposed to cleaning solutions such as disclosed above. These cleaning solutions must not corrode the aluminum or tungsten or otherwise radically change the surface morphology. In order to demonstrate the efficacy of the above cleaning solution experiments were conducted using aluminum and tungsten. The results of those experiments are set forth in the following Examples 9 and 10.

EXAMPLE 9

Cleaning solutions were evaluated for the tendency to corrode aluminum. Aqueous solutions of an alkanolamine (monoethanolamine) with and without an added quaternary ammonium hydroxide ([carboxymethyl]trimethylammonium hydroxide inner salt) were prepared:

| Solution | Components (Parts by Weight) |
|---|---|
| A | monoethanolamine (80) + water (20) |
| B | solution A + 0.6% (carboxymethyl)trimethylammonium hydroxide inner salt |
| C | monoethanolamine (40) + water (60) |
| D | solution C + 0.3% (carboxymethyl)trimethylammonium hydroxide inner salt |

Identical blanket aluminum (containing 0.5% copper) on silicon wafer pieces were submersed in stirred solutions A and B for 10 minutes at 65° C. Four point probe measurements for sheet resistance were made on these pieces prior to and after treatment. Aluminum etch rates (in Angstroms per minute) for the solutions were calculated:

| | |
|---|---|
| Solution A | 22 A/min. |
| Solution B | 17 A/min. |

Coupons of 99.8% aluminum (0.05×12×40 mm) were cleaned in water, isopropanol, dried and weighed. Coupons were heated in solutions C and D for 3 hours at 65° C., the coupons were removed, rinsed with water, isopropanol, dried and reweighed. Weight losses were converted to the following corrosion rates:

| | |
|---|---|
| Solution C | 49 A/min. |
| Solution D | 19 A/min. |

The results show the ability of a quaternary ammonium hydroxides to moderate aluminum corrosion that accompanies exposure to alkanolamines.

EXAMPLE 10

Cleaning solutions were evaluated for the tendency to corrode tungsten. Aqueous solutions of alkanolamines corrode tungsten very slowly making the etch rates difficult to measure. Adding a dipolar aprotic solvent, in this case N,N-dimethylacetamide, increases corrosion rates to a measurable range. The following alkanolamine (monoethanolamine) solutions with and without an added quaternary ammonium hydroxide (tetramethylammonium hydroxide) were prepared:

| Solution | Components (Parts by Weight) |
|---|---|
| E | N,N-dimethylacetamide (89) + monoethanolamine (9) + water (2) |
| F | solution E + 0.5% tetramethylammonium hydroxide |

Coupons of 99.9+% tungsten (0.05×10×24 mm) were cleaned in water, then acetone, dried and weighed. Coupons were heated in solutions E and F for 5 hours at 85° C., the coupons were removed, rinsed with water, then acetone, dried and reweighed. Weight losses were converted to the following corrosion rates:

| | |
|---|---|
| Solution E | 200 A/hour |
| Solution F | 90 A/hour |

The results show the ability of a quaternary ammonium hydroxides to moderate tungsten corrosion that accompanies exposure to alkanolamines.

From the foregoing examples it is evident that cleaning solutions according to the invention described herein will not only clean but have little adverse effects on exposed aluminum or tungsten surfaces on a microelectronic device.

Although the invention is illustrated and described herein with reference to specific embodiments, the invention is not intended to be limited to the details shown. Rather, various modifications may be made in the details within the scope and range of equivalents of the claims without departing from the invention.

What is claimed is:

1. A cleaning composition for cleaning microelectronic substrates, consisting of:
   0.30 to 22.0% by weight alkanolamine;
   0.02 to 13.5% by weight tetramethylammonium hydroxide;
   balance water,
   wherein the alkanolamine is selected from the group consisting of 1-amino-2 propanol, 2-(methylamino) ethanol and mixtures thereof, and wherein the cleaning composition is useful for removing residue from a microelectronic substrate having same thereon.

2. The composition according to claim 1 wherein the pH of the composition is greater than 10.

3. The composition according to claim 1 wherein the residue comprises post-chemical mechanical polishing (CMP) residue.

4. A cleaning composition for cleaning microelectronic substrates consisting of:
   0.09 to 22.0% by weight alkanolamine;
   0.02 to 13.5% by weight tetrabutylammonium hydroxide;
   balance water,
   wherein the alkanolamine is selected from the group consisting of monoethanolamine, 1-amino-2 propanol, 2-(methylamino)ethanol, triethanolamine and mixtures thereof.

5. The composition according to claim 4 wherein the pH of the composition is greater than 10.

6. A composition according to claim 1 wherein said alkanolamine is present in an amount between 0.30 and 0.70% by weight, said tetramethylammonium hydroxide is present in an amount between 0.02 to 0.70% by weight, balance water.

7. A method of fabricating a microelectronic substrate comprising: (a) CMP processing a metal-containing substrate to form a chemical mechanical polishing (CMP) processing substrate; and (b) cleaning said CMP processed substrate with the cleaning composition of claim 1.

8. A method of fabricating a microelectronic substrate comprising: (a) CMP processing a metal-containing substrate to form a CMP processing substrate; and (b) cleaning said CMP processed substrate with the cleaning composition of claim 4.

9. The method of claim 7, wherein the microelectronic substrate comprises at least one of Cu, Al, W, TiN, Ta, TiW and Silica.

10. The method of claim 7, wherein the metal comprises copper.

11. The method of claim 7, wherein the cleaning of said processed substrate is carried out at temperature in a range from ambient temperature to about 70° C.

12. The method of claim 8, wherein the microelectronic substrate comprises at least one of Cu, Al, W, TiN, Ta, TiW and Silica.

13. The method of claim 8, wherein the metal comprises copper.

14. The method of claim 8, wherein the cleaning of said processed substrate is carried out at temperature in a range from ambient temperature to about 70° C.

* * * * *